United States Patent

Kruppa et al.

[15] 3,644,700

[45] Feb. 22, 1972

[54] METHOD AND APPARATUS FOR CONTROLLING AN ELECTRON BEAM

[72] Inventors: Robert W. Kruppa, Hopewell Junction; Edward V. Weber; Ollie C. Woodard, both of Poughkeepsie, all of N.Y.

[73] Assignee: International Business Machines Corporation, Armonk, N.Y.

[22] Filed: Dec. 15, 1969

[21] Appl. No.: 884,900

[52] U.S. Cl. .......... 219/121 EB, 315/22

[51] Int. Cl. .......... B23k 9/08

[58] Field of Search .......... 29/583; 264/22; 219/68, 121 RB; 250/49.5; 315/10, 22

[56] References Cited

UNITED STATES PATENTS

| | | | |
|---|---|---|---|
| 3,519,788 | 7/1970 | Hatzakis | 219/121 RB |
| 3,491,236 | 1/1970 | Newberry | 250/49.5 O |
| 3,196,246 | 7/1965 | El-Kareh | 219/121 RB |
| 3,134,044 | 5/1964 | Auvil | 315/10 |
| 3,308,264 | 3/1967 | Ullery, Jr. | 219/121 RB |

*Primary Examiner*—Rodney D. Bennett, Jr.
*Assistant Examiner*—N. Moskowitz
*Attorney*—Hanifin and Jancin and Henry Powers

[57] ABSTRACT

A square-shaped electron beam is stepped from one predetermined position to another to form a desired pattern on each chip of a semiconductor wafer to which the beam is applied. For each chip to which the beam is applied, the position of the chip relative to a predetermined position is determined and the distance in these positions is utilized to control the position of the electron beam to insure that the desired pattern is formed on each of the chips separately. Furthermore, the position of the beam is periodically checked against a calibration grid to ascertain any deviations in the beam from its initial position. These differences are applied to properly position the beam.

51 Claims, 13 Drawing Figures

INVENTORS
ROBERT W. KRUPPA
EDWARD V. WEBER
OLLIE C. WOODARD

BY Frank C. Leach Jr.
ATTORNEY

METHOD AND APPARATUS FOR CONTROLLING AN ELECTRON BEAM

In the manufacture of semiconductors, minute and very accurate patterns must be formed in the resist on the surface of the semiconductor material. If a plurality of chips, for example, is to have the same characteristics, it is necessary that any mask, which is used to form a pattern in the resist, be accurate. Otherwise, the yield of the chips produced from the mask will be relatively low. For successful fabrication of chips on semiconductor wafers, it is necessary that the mask be accurate and capable of reproducing the same pattern many times without any significant deviations therefrom.

One previously suggested method for forming a mask has been to describe the pattern as an input to a computer program. The output from the computer program is a magnetic tape that is used to drive a light table which draws the desired pattern for a single chip at 10 times the size of the pattern for the single chip.

After processing and inspection, the 10-times-single-size mask is placed in a step-repeat camera where the pattern is reduced to the size of the pattern for a single chip. To fill the wafer area on the master mask so that all of the chips on the wafer can be formed simultaneously, the pattern can be reproduced a desired number of times. This master mask is then contact printed to form working masks; the working masks are contact printed on light-sensitive resist on the wafer. This results in the resist on the wafer being exposed.

The foregoing process is relatively expensive, particularly for low volume parts. Furthermore, due to the small size of the pattern, the material of the mask, which is the size of the pattern, tends to have significant defects therein whereby spoiled chips are created on the wafer. As a result, the wafer must be discarded.

Furthermore, the operation of contacting the resist-coated wafer creates additional defects in the mask to cause additional yield loss. Thus, the previously suggested method is relatively expensive and time consuming.

The present invention satisfactorily overcomes the foregoing problems by eliminating the requirement for the formation of any mask. Instead, the present invention utilizes an electron beam to expose the resist directly. As a result, the various potential areas for error in forming the various masks are eliminated. Additionally, the present invention is an order of magnitude cheaper than presently available methods of masking in some situations.

Therefore, the present invention not only produces chips that are less expensive but also of higher yield and in a shorter period of time. Furthermore, the present invention is particularly useful for low-volume parts.

In the present invention, the beam of charged particles is moved in a substantially raster fashion so that any point within the field to which the beam is applied is always reached by the same history. This eliminates the significant problems of thermal changes, hysteresis, eddy currents, and the like.

To extend the accuracy of the position of the beam beyond short term repeatability that is obtained through moving the beam in a substantially raster fashion, a known target is periodically scanned by the beam and errors between the positions of the target and the beam are ascertained. Any corrections are applied to a second deflection circuit for the beam so as to not disrupt the history of the beam that is obtained by moving it in the substantially raster fashion.

Thus, the present invention insures that the beam is continuously positioned in accordance with its history. Therefore, it is only necessary to know the position of the material to which the beam is to be applied and the pattern to be formed on the material for the beam to be correctly positioned.

Accordingly, the present invention ascertains the position of the material to which the beam is to be applied in comparison with the desired position and modifies the position of the beam in accordance therewith. This modification of the beam also is made through the second deflection means so as to not disrupt the history of the movement of the beam in the substantially raster fashion.

To insure that the patterns formed by the beam are sharp and that the width of each line of the pattern is controlled to its desired size, the beam is stepped from one predetermined position to another in forming the desired pattern. In this manner, the full energy of the beam is applied to each of the predetermined positions in accordance with the desired pattern to insure that there is sufficient energy to expose the resist. The present invention applies a bucking signal to the second deflection means to hold the beam at each of its predetermined positions for a sufficient period of time to allow sufficient energy from the beam to be applied to the material to expose the resist at each predetermined position.

An object of this invention is to position an electron beam at various positions on a target in accordance with a desired pattern.

Another object of this invention is to use an electron beam to expose selected areas of resist on a chip on a semiconductor wafer.

A further object of this invention is to position an electron beam at various positions on a target in registration with a prior pattern.

The foregoing and other objects, features, and advantages of the invention will be more apparent from the following more particular description of the preferred embodiment of the invention as illustrated in the accompanying drawings.

FIGS. *3a–3d* show timing charts illustrating the various signals applied to the beam and the resultant movement of the beam in the X or horizontal direction.

Figure 4:
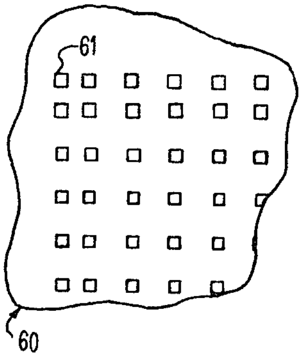

FIG. 4 is an enlarged top plan view of a portion of a calibration grid used to ascertain the deviation of the beam during a calibration cycle.

Figure 5:
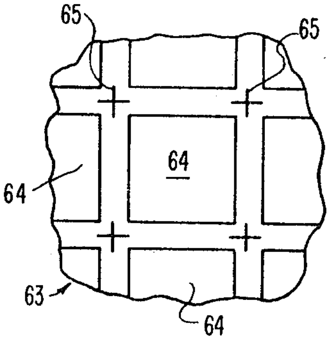

FIG. 5 is an enlarged top plan view of a portion of a water having chips to which the beam is to be applied.

Figure 6:
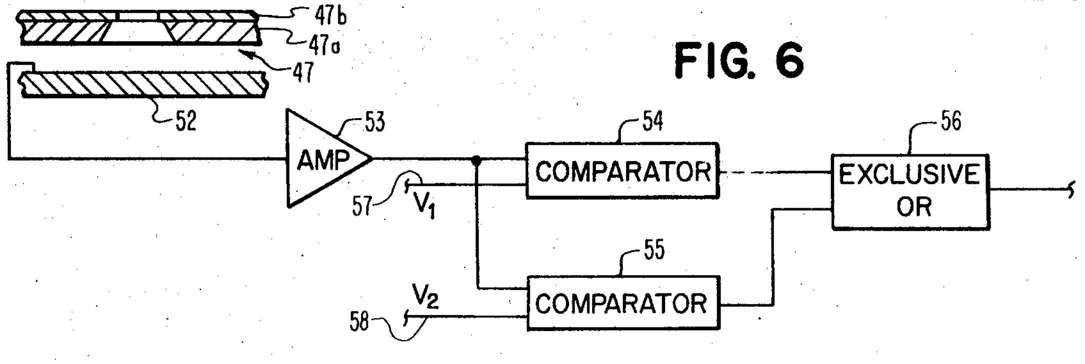

FIG. 6 is a schematic view, partly in section, illustrating an electron detector for determining the position of the beam relative to a focus or calibration grid.

Figure 7:
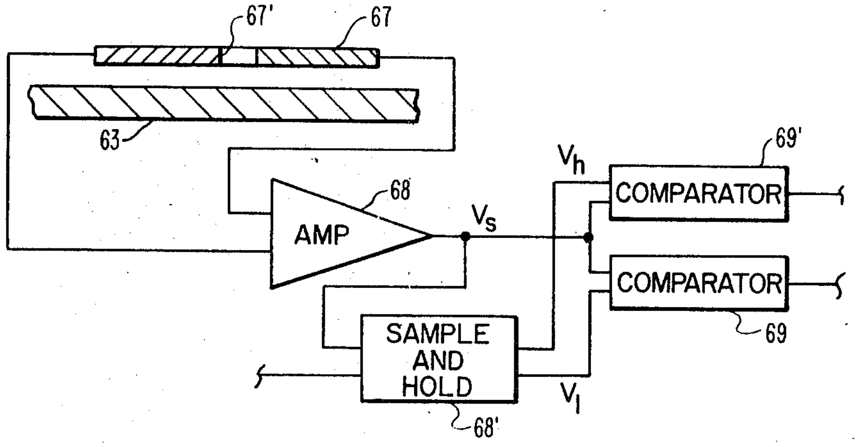

FIG. 7 is a schematic view, partly in section, illustrating a portion of an electron detector for determining the position of the beam relative to a chip on the semiconductor wafer.

Figures 8, 10:
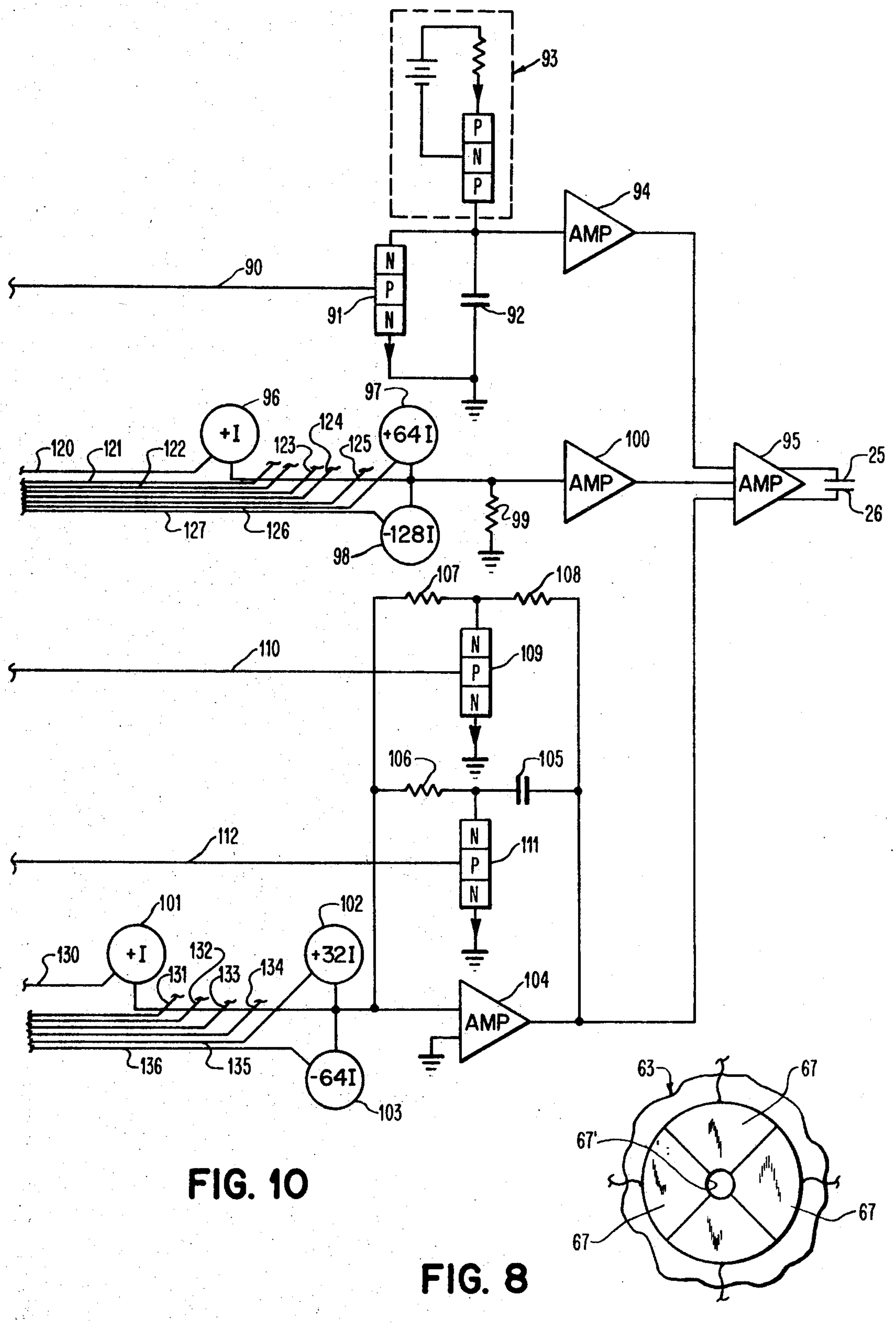

FIG. 8 is a schematic top plan view of a portion of the detector of FIG. 7 and showing the arrangement of the PIN diodes.

Figure 9:
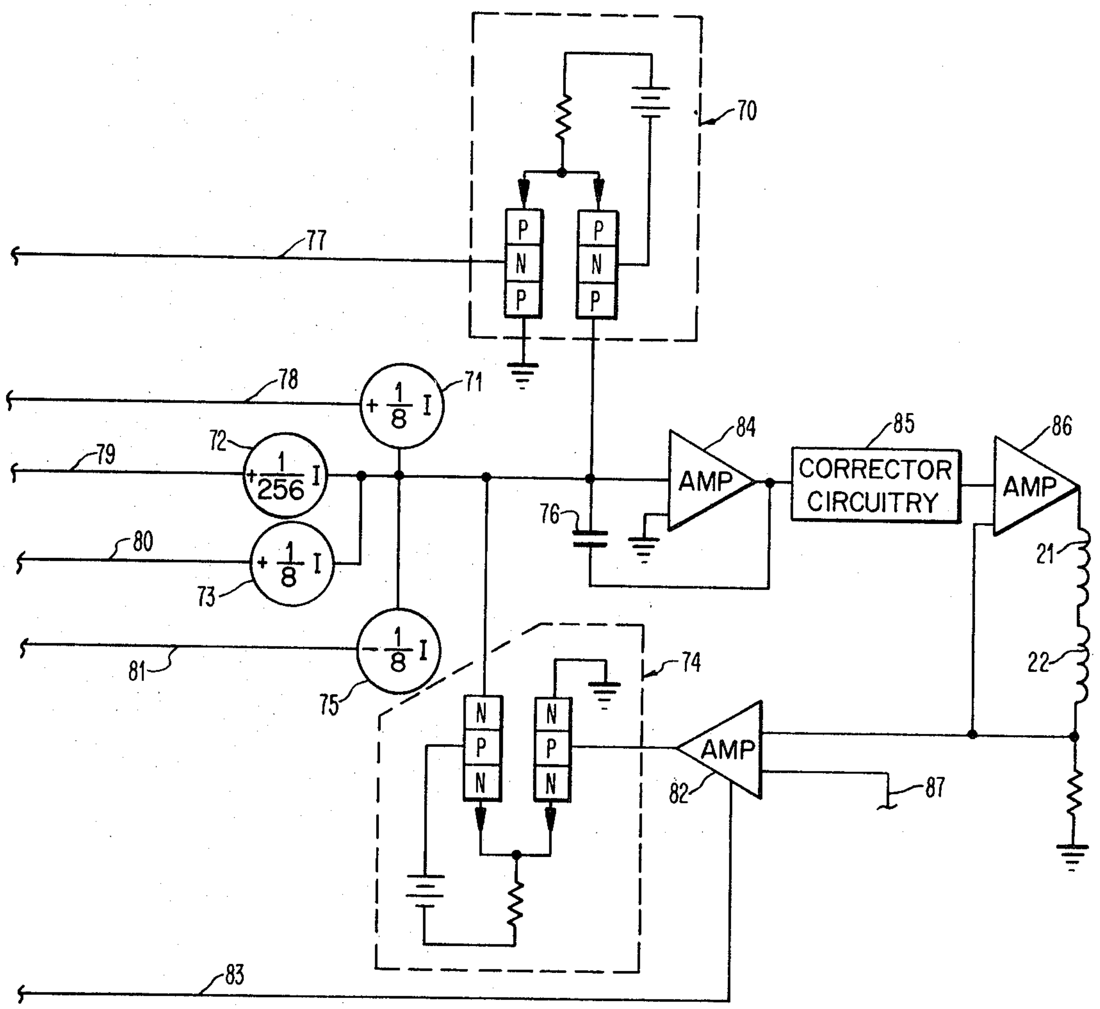

FIG. 9 is a schematic wiring diagram showing the magnetic deflection circuit for the X magnetic deflection coils.

FIG. 10 is a wiring diagram of the electrostatic deflection circuit for controlling the X electrostatic deflection plates.

Figure 1:
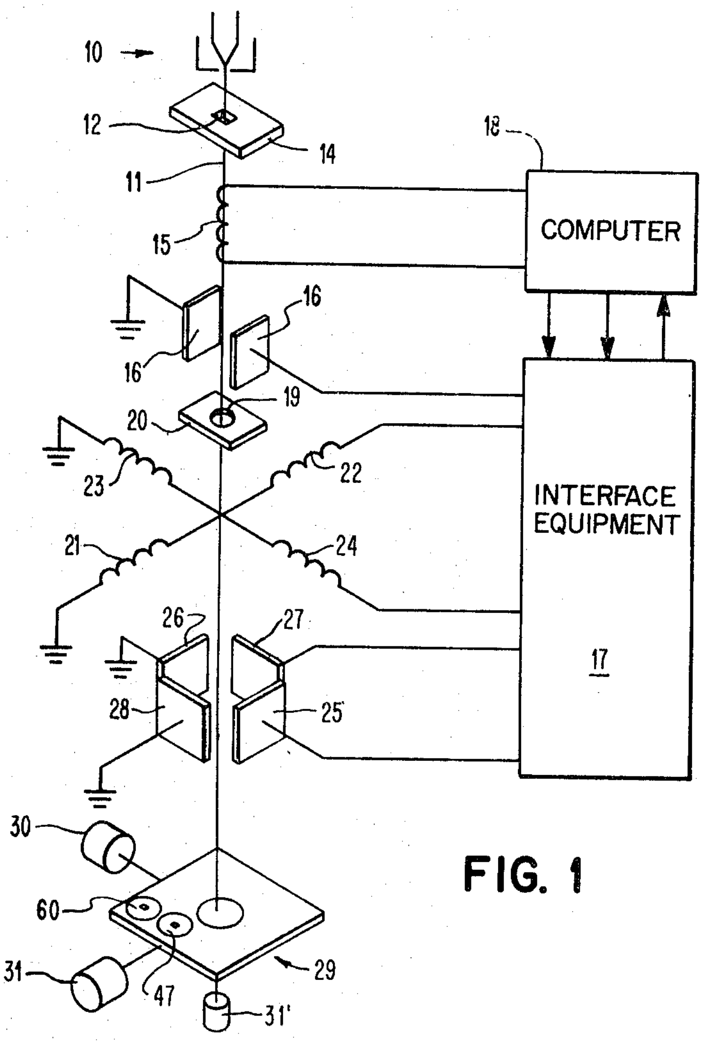
FIG. 1 is a schematic view showing the apparatus of the present invention for controlling the position of an electron beam.

Referring to the drawings and particularly FIG. 1, there is shown an electron gun 10 for producing a beam 11 of charged particles in the well-known manner. The electron beam 11 is passed through an aperture 12 in a plate 14 to shape the beam 11. The beam 11 is preferably square shaped and has a size equal to the minimum line width of the pattern that is to be formed.

The beam 11 passes through a focusing coil 15 and then between a pair of blanking plates 16, which determine when the beam is applied to the material and when the beam is blanked. The blanking plates 16 are controlled from circuits, which form part of interface equipment 17. The interface equipment 17 is connected to a computer 18, which is preferably an IBM 1800 computer. The computer 18 controls the focusing coil 15.

The beam 11 then passes through a circular aperture 19 in a plate 20. This controls the beam 11 so that only the charged particles passing through the centers of the lenses (not shown) are used so that a square-shaped spot without any distortion is produced.

The beam 11 is next directed between magnetic deflection coils 21, 22, 23, and 24. The magnetic deflection coils 21 and 22 control the deflection of the beam 11 in a horizontal or X direction while the magnetic deflection coils 23 and 24 control the deflection of the beam 11 in a vertical or Y direction. Accordingly, the coils 21–24 cooperate to move the beam 11 in a substantially raster fashion by appropriately deflecting the beam 11.

The beam 11 then passes between electrostatic deflection plates 25, 26, 27, and 28. The plates 25 and 26 cooperate to deflect the beam in the horizontal or X direction while the electrostatic deflection plates 27 and 28 cooperate to move the beam 11 in the vertical or Y direction. The plates 25–28 are employed to correct the position of the beam 11 without affecting the history of its movement in the substantially raster fashion by the magnetic deflection coils 21–24.

The beam 11 is then applied to a target, which is supported on a table 29. The table 29 is moved in the horizontal or X direction by a stepping motor 30, in the vertical or Y direction by a stepping motor 31, and in a direction parallel to the beam travel or Z direction by a stepping motor 31′. The stepping motors 30, 31, and 31′ have their movements controlled by the computer 18.

As previously mentioned, the beam 11 is always moved in the same manner by the magnetic deflection coils 21–24 so as to not affect the history of its movement in a substantially raster fashion. Accordingly, the movement of the beam 11 by the magnetic deflection coils 21–24 is in an A cycle, a B cycle, and a C cycle. After each C cycle is completed, the sequence begins again with the A cycle. Thus, as long as the beam 11 is activated, it operates continuously in the same sequence.

In both the A and B cycles, the beam 11 is deflected in the X direction by the X magnetic deflection coils 21 and 22 for a distance equal to 2,000 lines with 48 additional lines of time being used for retrace time. In the A cycle, the movement of the beam in the X direction occurs for 128 Y or vertical lines while the beam 11 moves through 2,000 Y or vertical lines in the X direction during the B cycle.

In the C cycle, the beam 11 is moved over a path that permits the focus of the beam 11 to be checked; this includes the astigmatism of the beam 11. In the C cycle, the beam 11 starts at the end of the B cycle. At the end of the C cycle, there is retrace to return the beam 11 to the position in which the cycle starts.

Since all correction signals for the beam 11 are made through the electrostatic deflection plates 25–28, the beam 11 always moves in the A, B, and C cycles without any interruption so that the history of movement of the beam 11 is not affected. It is necessary to apply the various correction signals through the electrostatic deflection plates 25–28 at the proper time in accordance with the position of the beam 11 and the particular operation being performed.

Furthermore, the beam 11 is blanked during some or all of the A, B, and C cycles depending upon the particular operation that is being accomplished. All of these various sequences in which none, one, two, or all of the A, B, and C cycles is blanked is controlled by cooperation between the computer 18 and the interface equipment 17.

Figure 2:
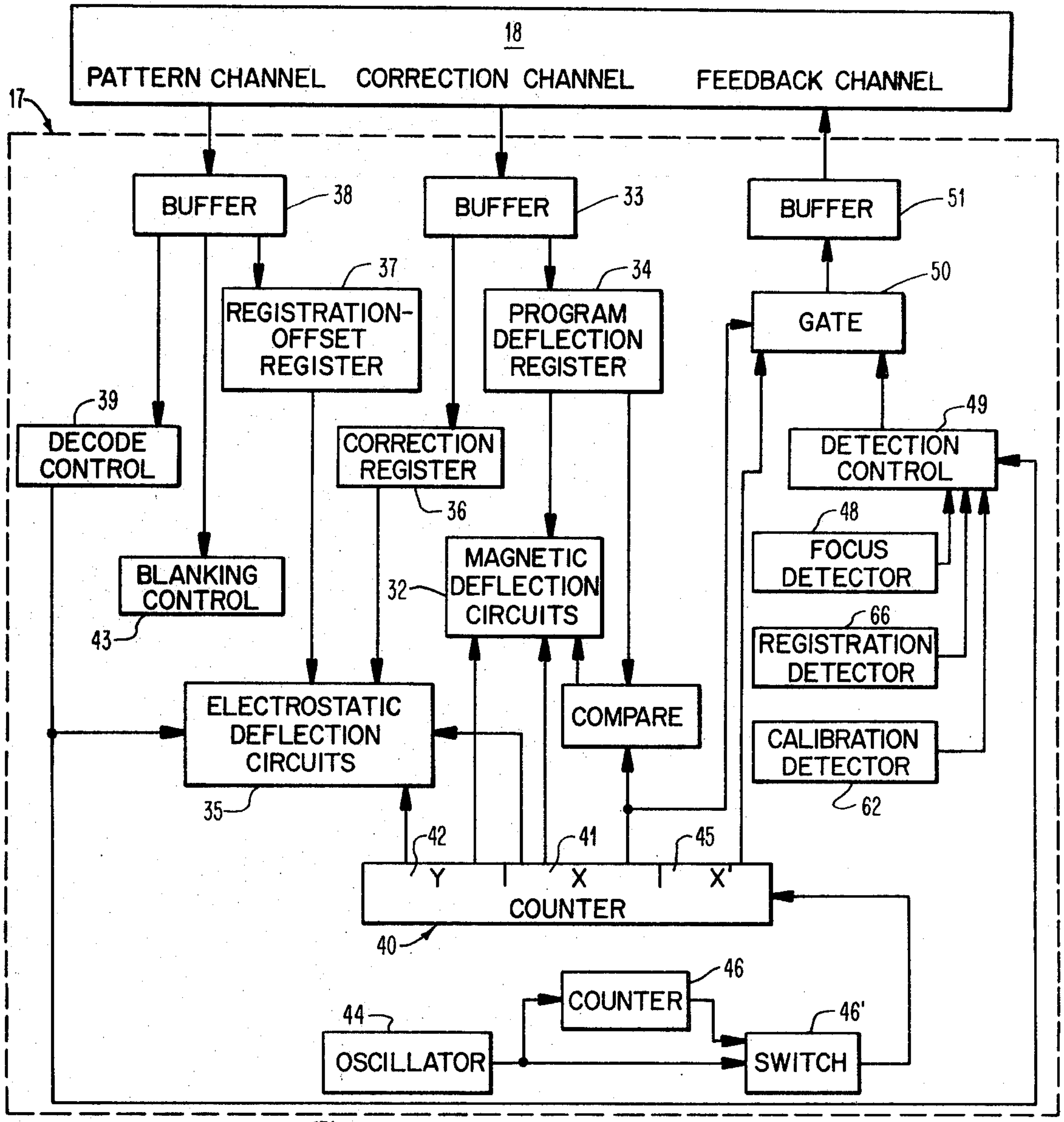
FIG. 2 is a block diagram showing the manner in which the electron beam pattern is generated.

Referring to FIG. 2, the communication between the computer 18 and the interface equipment 17 is through three data channels. These data channels are Pattern Channel, Correction Channel, and Feedback Channel.

The Pattern Channel handles blanking information, registration-offset data, and other nonrepetitive data while the Correction Channel handles correction data and program deflection data. The Feedback Channel handles beam addresses that indicate where various marks are located in various portions of the operations of the apparatus of the present invention. The signals are derived during the registration, calibration, and focus operations.

The signals to the magnetic deflection coils 21–24 are supplied by magnetic deflection circuits, which are schematically indicated at 32 in FIG. 2. The magnetic deflection circuits 32 supply signals to the magnetic deflection coils 21–24 to continuously move the beam 11 through the A, B, and C cycles. The computer 18 is connected to the magnetic deflection circuits 32 through the Correction Channel. The Correction Channel includes a buffer 33, which comprises a plurality of shift registers, and a program deflection register 34.

The magnetic deflection circuits 32 receive signals from the program deflection register 34 during the A and C cycles. The magnetic deflection coils 21–24 also receive signals from a counter 40 during the A and B cycles. Thus, these signals insure that the beam 11 continuously travels in the A, B, and C cycles.

The signals to the electrostatic deflection plates 25–28 are provided from electrostatic deflection circuits, which are schematically indicated at 35 in FIG. 2. The electrostatic deflection circuits 35 receive signals from the buffer 33 of the COrrection Channel by a correction register 36.

The electrostatic deflection circuits 35 also receive signals from a registration-offset register 37, which is connected to the computer 18 through a buffer 38 of the Pattern Channel. The buffer 38 comprises a plurality of shift registers.

The electrostatic deflection circuits 35 also receive signals from a decode control 39 and a counter 40. The counter 40 includes an X counter 41 and a Y counter 42, which are part of the counter 40 but are identified separately for explanatory purposes.

The blanking plates 16 are controlled by a blanking control 43, which includes a counter and a shift register. Accordingly, the blanking control 43, which receives its input from the buffer 38 of the Pattern Channel, blanks the beam 11 whenever it is desired to prevent application of the beam 11 to the target even though the beam 11 continues to move through one of the A, B, or C cycles. Thus, the blanking control 43 is employed to determine when the beam 11 is unblanked during the A, B, and C cycles.

To control the timing, the interface equipment 17 includes a 16 MHz. crystal oscillator 44 to clock the entire system. The oscillator 44 drives the counter 40, which is connected to the magnetic deflection circuits 32 and the electrostatic deflection circuits 35.

As shown in FIG. 2, the counter 40 not only comprises the X counter 41 and the Y counter 42 but also an X′ counter 45. Both the X counter 41 and the Y counter 42 have a maximum count of 2,048 while the X′ counter 45 is a four-bit counter, which subdivides the X counter 41 into 16 parts. Even though one count of the X counter 41 is equal to a line width of the beam 11 and the beam address resolution is only the line width of the beam 11, the X′ counter 45 aids in sensing the position of various identifying marks during calibration and registration operations.

The oscillator 44 may be connected directly to the counter 40 or may be connected to the counter 40 through a counter 46, which is a four-bit counter, depending on the position of a switch 46′. The counter 46 slows down the counters 41, 42, and 45 to a minimum of one-sixteenth of their normal speeds. Furthermore, by utilizing both the counter 46 and the X′ counter 45, the count in the X direction can be reduced to one two hundred fifty-sixths of the count from the X counter 41. This is useful when the speed of the beam 11 in the X direction is reduced during the A cycle to one two hundred fifty-sixths of its speed in the B cycle.

In the operation of the present invention, a focus operation is the first requirement. This checks the focus of the beam including its astigmatism. This is accomplished through using only the C cycle. During the A and B cycles in this focus operation, the beam 11 is blanked by the blanking control 43.

After the beam 11 has been properly focused, the calibration operation occurs. During calibration, the beam 11 is operated only in the B cycle with the A and C cycles being blanked so that the error in deflection in the beam 11 during the B cycle is determined. These errors are first determined for the deflection of the beam 11 in the X or horizontal direction and then are determined in the vertical or Y direction.

After the deflection errors for the beam 11 in both the X and Y directions have been determined, the beam 11 is operated only in the A cycle in both the X and Y directions. Then, the beam 11 is again operated in the B cycle to determine the correlation in the vertical and horizontal directions of the beam 11 between the A cycle and the B cycle.

The foregoing operations result in the beam 11 being focused and calibrated properly. Then, the beam 11 may be used in the registration operation and subsequently to expose resist on semiconductor wafer chips.

In the registration operation, only the A cycle is initially employed to locate two diametrically disposed wafer registration marks on a semiconductor wafer while the B and C cycles are blanked. Then, an A cycle is used to locate registration marks associated with a chip which is to have its resist exposed. During the B cycle following the A cycle, the resist is exposed. During the C cycle, the beam 11 is blanked, and the semiconductor wafer on the table 29 is moved by moving the table 29 to position another of the chips on the semiconductor wafer at the position in which the beam 11 may be applied thereto.

The operation continues until all of the chips on a semiconductor wafer have had the resist thereon exposed in a desired pattern. Then, another wafer is disposed on the table 29 and the operation is repeated. This continues until focusing and calibration operations are again required as determined by either the operator or the computer 18. It should be understood that the A, B, and C cycles would be blanked by the blanking control 43 during the time that one semiconductor wafer is being removed from the table 29 and another semiconductor wafer is being positioned on the table 29.

To ascertain the correct focus and astigmatism of the beam 11, a focus grid 47 (see FIG. 1) is permanently mounted on the table 29. The focus grid 47 may be formed of a circular, self-supporting copper foil 47*a* (see FIG. 6) having a thickness of 10 mils and a diameter of 1 inch over which a thin nickel layer 47*b* has been electrodeposited. The nickel layer 47*b* has 13 L-shaped groups of openings distributed over a 0.200 inch by 0.200 inch area with each L-shaped group having a specific orientation. The copper substrate 47*a* is etched out only underneath each of the L-shaped groups of openings.

When the table 29 has properly positioned the focus grid 47 in the field of the beam 11, the beam 11 is moved during the C cycle in the desired pattern to ascertain the focus of the beam 11. A focus detector 48 (see FIG. 2) is employed to determine the rise time of the signal resulting when the beam 11 enters one of the L-shaped openings and when it leaves one of the L-shaped openings.

The signal from the focus detector 48 is transmitted by a detection control 49 to a gate 50 in the Feedback Channel to the computer 18. The gate 50 is connected to the computer 18 through a buffer 51, which comprises a plurality of shift registers.

The detection control 49 allows the focus detector 48 to transmit its signal to the gate 50 only when an appropriate signal is supplied to the detection control 49 from the decode control 39. This insures that the computer 18 receives signals concerning focus only at the desired time.

The focus detector 48 may include a PIN diode 52 (see FIG. 6) disposed beneath the entire area of the focus grid 47. Accordingly, whenever the beam 11 enters one of the L-shaped openings, a different signal is obtained from the PIN diode 52 than when the beam 11 is merely contacting the nickel layer 47*b*. Likewise, when the beam 11 leaves one of the openings in the focus grid 47, a different signal is produced by the PIN diode 52.

As shown in FIG. 6, the focus detector 48 may include an amplifier 53 receiving signals from the PIN diode 52, which is disposed beneath the focus grid 47. The output of the amplifier 53 is $V_f$, which is compared to reference voltages $V_1$ and $V_2$ by comparators 54 and 55. The voltages $V_1$ and $V_2$ are adjusted to the nominal 20 percent and 80 percent values of the focus signal $V_f$. The voltage $V_1$ is supplied to the comparator 54 by a line 57, and the voltage $V_2$ is supplied to the comparator 55 by a line 58.

The difference in time between activation of the comparator 54 and the comparator 55 is an indication of rise time of the signal $V_f$. The inverse is also true for the fall time.

The outputs of the comparator 54 and the comparator 55 are the inputs of an exclusive OR logic circuit 56, which converts their outputs to signals having a duration equal to the rise and fall times of the signal $V_f$. It is this signal which is passed on to the detection control 49 and causes the gate 50 to be activated on each rise and fall.

Since each activation of the gate 50 supplies signals from the X counter 41 and the X' counter 45 to the computer 18, any deviation of the focus including its astigmatism is readily ascertained. These signals are supplied through a focus-correcting circuit (not shown) in the computer 18 to the focusing coil 15 to position the beam 11.

After the beam 11 has had its focus and astigmatism corrected if needed, a calibration grid 60, which is permanently mounted on the table 29 adjacent the focus grid 47 as shown in FIG. 1, is disposed in the field of the beam 11 by movement of the table 29. The calibration grid 60 (see FIG. 4) is employed to ascertain whether the beam 11 is in the desired path during deflection thereof in the X and Y directions by the magnetic deflection coils 21–24.

One suitable example of the calibration grid 60 is a circular, self-supporting copper foil having a thickness of 10 mils and a diameter of 1 inch over which a thin nickel layer has been electrodeposited. The nickel layer carries the 0.200 inch by 0.200 inch pattern of openings with the copper substrate being etched out underneath this pattern area.

The pattern of the calibration grid 60 comprises 32 rows and 32 columns of square openings or holes 61 with each opening or hole being 0.001 inch by 0.001 inch. Except for the first column and the first row, all of the square openings or holes 61 are 0.0064 inch apart from the center of one hole or opening to the center of the adjacent hole or opening. The center to center distances between the first and second rows of the holes or openings 61 and the center to center distance between the first and second columns of the holes or openings 61 is 0.0026 inch. This enables the location of the calibration grid 60 to be readily ascertained.

When the calibration grid 60 is properly disposed, the B cycle is utilized to calibrate the horizontal or X movement of the beam 11 in accordance with the known position of the calibration grid 60. Thus, to calibrate the horizontal error, the beam 11 is moved in the horizontal or X direction through the B cycle without the electrostatic bucking operating.

During this movement of the beam 11 through the B cycle, the beam 11 enters and exits through the various openings or holes 61 in the calibration grid 60. As the beam 11 moves over the grid 60, a calibration detector 62 (see FIG. 2) supplies signals to the detection control 49. Since the detection control 49 should receive a signal from the decode control 39 during this time, the gate 50 is activated during each time that the beam 11 enters or leaves one of the openings or holes 61.

When the gate 50 is activated, the X counter 41 and the X' counter 45 are connected to the computer 18 to store the information as to the X coordinate at which the beam 11 enters and leaves the opening 61. The computer 18 then determines any error between each of the positions of the beam 11 and the known position of the opening 61 in the calibration grid 60.

The calibration detector 62 employs the same type of structure as the focus detector 48. Therefore, its operation will not be described.

After the calibration of the beam 11 in the horizontal or X direction has been completed, the calibration for the beam 11 is made in the Y or vertical direction. The beam 11 is still moved in the X direction by the magnetic deflection coils 21 and 22. However, it is held for four units of time (This is four Y lines.) by a bucking sawtooth signal, which is applied to the electrostatic deflection circuit 35 for the X electrostatic deflection plates 25 and 26. This is accomplished through supplying a signal from the decode control 39 to the electrostatic deflection circuit 35 for the X electrostatic deflection plates 25 and 26.

During the time that the bucking sawtooth is applied to the X electrostatic deflection plates 25 and 26, a signal is supplied to the Y electrostatic deflection plates 27 and 28 from the Y electrostatic deflection circuit to move the beam 11 four lines in the Y direction. This enables the beam 11 to traverse the edges of the openings 61 in the calibration grid 60 in the Y or vertical direction without disturbing the magnetic deflection.

Accordingly, the calibration detector 62 again supplies signals to the gate 50 when the detection control 49 is activated by the decode control 39. These signals are supplied by the Feedback Channel to the computer 18 to permit any errors of the beam 11 from the known position of the openings 61 to be determined by the computer 18. The gate 50 still allows only counts from the X counter 41 and the X' counter 45 to be supplied to the computer 18 through the buffer 51. The counts from the X counter 41 are interpolated by the computer 18 to correspond to the Y coordinates.

After the B cycles for horizontal and vertical calibration of the beam 11 have been completed, the calibration grid 60 is positioned by moving the table 29, if necessary, to position one of the holes or openings 61 at a specific position. Then, the beam is moved through an A cycle to determine the center of the hole. There are two portions of the A cycle with one being a movement only in the X direction and the other being the movement in which a bucking sawtooth is applied to hold the beam 11 at a position for four units of time and to advance the beam in the Y direction four lines in the same manner as previously described for the B cycle in which vertical calibration was made.

With the exact center of the hole being located in the A cycle, the beam 11 is moved in the B cycle both horizontally and vertically in the manner previously described for horizontal and vertical calibration to locate the center of the hole. This data is then used with the data, which was obtained during the A cycle, to obtain correlation between the A and B cycles.

The correlation between the A and the B cycle scans consists of determination of the location of the center of the calibration grid holes in B cycle counts and also in A cycle counts. In addition, the size of the hole is determined in both A cycle and B cycle counts. Accordingly, any mark center located in A cycle counts can have its center translated to B cycle counts by appropriate mathematical manipulation, and, thus, its error from the desired position determined.

After the deviations of the beam 11 from its desired path have been determined and stored by the computer 18, a semiconductor wafer 63 (see FIG. 5) is disposed on the table 29. It should be understood that the semiconductor wafer 63 may be mounted on the table 29 by any suitable wafer-handling means, which could be controlled by the computer 18. Furthermore, all of this occurs within a vacuum; even the electron column is within the vacuum.

The mechanical location of the wafer 63 on the table 29 is by points on the curved edge of the wafer 63 engaging retaining walls on the table 29. The points on the curved edge are moved into engagement with the retaining walls on the table 29 by an arm disposed in an orientation notch in the wafer 63.

Because of the relatively poor edge of the wafer and the poor edges of the orientation notch, the actual wafer position is only known to several mils and perhaps a degree of rotation. The area of the wafer scanned for chip registration marks and the electronic registration capability may not correct for errors in some instances. In any event, it is undesirable to make large corrections of both rotation and X, Y position for each of a plurality of chips 64 on the wafer 63.

To eliminate this problem, a scan is initially made for special wafer registration marks located in areas which are not used for chips and correspond to fractional chip areas on the perimeter of the wafer. The marks are large and are so designed that they can be scanned with the small A cycle window used for chip registration so that the computer 18 can determine from the small portion of the mark scanned the distance to the mark center. This operation is repeated for a second wafer registration mark on a diametrically opposite side of the wafer.

From these measurements and the known locations of the wafer registration marks, the computer 18 can determine the X, Y, and rotation errors of the wafer from the desired position. The table 29 is then rotated to position the wafer 63 to eliminate the rotation error and new X and Y errors, which result from the rotation correction, are then computed.

It should be understood that the table 29 can be rotated by a motor (not shown). The table 29 also could be rotated by moving the table 29 by the stepping motor 30 to one extreme in the X direction and then actuating the stepping motor 31 to rotate the table 29 through retaining an arm (not shown) on one end of the table 29.

The semiconductor wafer 63, which has a plurality of chips 64 thereon, is positioned by the table 29 as close to the field of the beam 11 as possible. Then, the position of registration marks 65, which could be crosses, for example, disposed at the opposite upper corners of the chips 64, are determined. This is accomplished through scanning in the X or horizontal direction during the first 30 lines of the A cycle to ascertain the position of the vertical line of each of the registration marks 65. During the next 30 lines of scanning in the X direction, a bucking sawtooth is applied to the electrostatic deflection plates 25 and 26 to retain the beam 11 at each position for four units of time while the beam 11 is deflected in the Y direction for four lines by supplying a signal to the Y electrostatic deflection plates 27 and 28. This indicates the position of the horizontal line.

The exact location of each of the registration marks 65 is determined by the computer 18 during the remaining time of the A cycle. This comprises the remaining 68 scan lines of the total of 128 lines of scan that occur during the A cycle.

The exact position of each of the registration marks 65 is supplied to the computer 18 since a registration detector 66 (see FIG. 2) detects when the beam 11 passes over each of the lines of the registration mark 65. The signals from the registration detector 66 activate the gate 50 when the detection control 49 is energized from the decode control 39. The detection control 49 allows only the registration detector 66 to transmit a signal at this time to the gate 50 due to the signal from the decode control 39.

The registration detector 66 is the same as the focus detector 48 except that four PIN diodes 67 (see FIGS. 7 and 8) are disposed above the semiconductor wafer 63 and have an opening 67' formed therebetween through which the beam 11 passes to impinge upon the wafer 63. The change of backscatter of the electrons from the wafer 63 when the beam 11 passes over one of the registration marks 65 creates the different signal on the diodes 67. While the diodes 67 are shown arranged in a quadrant arrangement in FIG. 8, they could be disposed in a rectangular arrangement or also with the plane of the diodes parallel to the travel of the beam 11, if desired.

Opposed pairs of the diodes 67 would be connected to a differential amplifier 68 as shown in FIG. 7. Just prior to the expected time of the beam 11 crossing the registration marks 65 on the wafer 63, a sample and hold circuit 68' is energized causing it to sample and hold the nominal background signal level $V_s$ at the output of the differential amplifier 68. Its output is used to generate a reference voltage slightly higher than nominal $V_h$ and a reference voltage slightly lower than nominal $V_1$. Thus, comparator 69 provides an output when the beam enters a depression in the wafer and comparator 69' provides an output when the beam exits a depression in the wafer. Each output corresponds to the output of the registration detector 66 and causes counter values to be gated back to the computer 18 in a manner similar to the focus detector 48.

Accordingly, the computer 18 receives signals as to the location of the registration marks 65 through the Feedback Channel. Correction signals are supplied to the electrostatic deflection circuits 35 through the Pattern Channel from the computer 18 in accordance with the distance that each of the registration marks 65 is disposed from the desired position. These signals are supplied to the electrostatic deflection circuits as a DC voltage through the registration-offset register 37.

During the location of the registration marks 65 on the chip 64, the speed of the beam 11 is slowed to one two hundred fifty-sixths of its speed during the B cycle by the magnetic deflection circuits 32. This slow scanning occurs only adjacent to each of the registration marks 65. During the remainder of the scan, the beam 11 moves at one-eighth of its speed during the B cycle.

At the beginning of the A cycle, the counter 46 is connected between the oscillator 44 and the counter 40 by activation of the switch 46'. In this manner, some added resolution of counts against distance on the wafer 63 is obtained, but not as excessive increase of resolution since this would make logical decode inconvenient.

At the completion of the A cycle, the beam 11 moves into the B cycle in which the resist on the chip 64 is exposed. At this time, the beam 11 is stepped from one predetermined position to another due to the bucking sawtooth being applied to the X electrostatic deflection plates 25 and 26 through a signal from the decode control 39. There are compensation signals through the registration-offset register 37 to the electrostatic deflection circuits 35 for the offset of the pattern being exposed and to correct registration of the particular chip 64. Additional compensation signals are provided through the correction register 36 to correct errors in sweep previously determined by the use of the calibration detector 62.

As the beam 11 is stepped from one predetermined position to another to form the desired pattern on the chip 64, blanking of the beam is obtained by the blanking control 43. This enables the beam 11 to continue to move along the path of the B cycle.

At the completion of the B cycle (At this time, the beam 11 has completed formation of the desired pattern in the chip 64.), the beam 11 is blanked by the blanking control 43 while the table 29 is positioned by the stepping motors 30 and 31 to dispose another of the chips 64 on the wafer 63 at a position in which the beam 11 may be applied to form the desired pattern therein. This movement of the table 29 occurs during the C cycle.

Then, the process of locating the registration marks 65 for the new chip 64 is made. This locating of the registration marks 65 is made during the A cycle.

The process of locating the marks in the A cycle, forming the pattern in the B cycle, and shifting the position of the table 29 in the C cycle is repeated for a plurality of the wafers 63 before the focus grid 47 and the calibration grid 60 are again employed. The time for this may be either programmed into the computer 18 or determined by the operator.

It should be understood that it is necessary to blank the beam 11 during the time that one of the wafers 63 is being removed from the table 29 and another of the wafers 63 is being loaded on the table 29. This blanking is accomplished by signals from the computer 18 through the Pattern Channel.

Figure 3A:
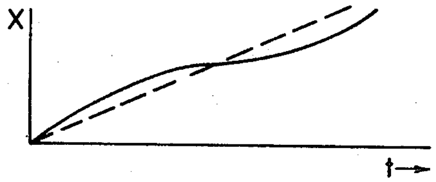

Referring to FIGS. 3*a*–3*d*, there are shown the various movements of the beam 11 in the X direction due to various signals applied to the X magnetic deflection coils 21 and 22 and the X electrostatic deflection plates 25 and 26. In FIG. 3*a*, the deflection of the beam 11 in the horizontal or X direction by the X magnetic deflection coils 21 and 22 is plotted against time. This chart shows that the beam 11 does not move linearly due to the magnetic deflection.

Figure 3B:
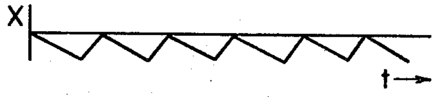
Figure 3C:
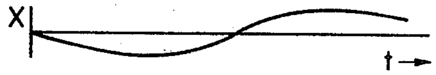

To linearly move the beam 11 in the X direction, it is necessary to apply a correction signal thereto. This signal, which is applied through the correction register 36 to the electrostatic deflection plates 25 and 26, is shown in FIG. 3*c*.

In exposing the resist on the chip 64, it is desired for the beam 11 to be positioned at each of a plurality of predetermined positions for a predetermined period of time. This is accomplished through applying a bucking sawtooth, which is shown in FIG. 3*b*, to the X electrostatic plates 25 and 26. This results in the beam 11 being retained in each of a plurality of predetermined positions for a predetermined period of time.

Figure 3D:
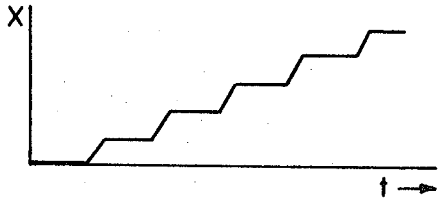

Accordingly, the total deflection of the beam 11 in the X direction is shown in FIG. 3*d* wherein the beam 11 remains in each of a plurality of predetermined positions for a predetermined period of time. During the time that the beam 11 is stepped from one of the positions to the next of the positions, the beam 11 is blanked by the blanking plates 16. This is the time in FIG. 3*d* in which there is an advance in the X direction.

It should be understood that there would be a DC voltage applied to the X electrostatic deflection plates 25 and 26. This signal would be supplied from the registration-offset register 37 and insures that the beam 11 is applied to the desired area of the chip 64.

As previously mentioned, the magnetic deflection circuits 32 control the X magnetic deflection coils 21 and 22 and the Y magnetic deflection coils 23 and 24. The magnetic deflection circuit for the X deflection coils 21 and 22 is shown in FIG. 9.

The circuit includes both positive constant current sources 70, 71, 72, and 73 and negative constant current sources 74 and 75. The current sources 70–75, controlled by logic control signals derived from the X counter 41, charge a capacitor 76. Each of the positive and negative constant current sources is not the same value so that the charge of the capacitor 76 may be different depending on which of the current sources 70–75 is used. Thus, the charge of the capacitor 76 for the different constant current sources 70–75 produces different voltage ramps, which have slopes dependent upon the value of the turned on current source. The length of the ramp is dependent upon the time that the current source is activated.

The positive current source 70 is turned on by a signal on a line 77 from the X counter 41 only during the B cycle. The positive current source 71 is turned on by a signal on a line 78 from the X counter 41 only during the A cycle.

The positive current source 72 is also turned on only during part of the A cycle from the program deflection register 34 by a signal on a line 79. When the positive current source 72 is turned on, the positive current source 71 is turned off.

The program deflection register 34 may also turn on the positive current source 73 by a signal on a line 80 or the negative current source 75 by a signal on a line 81. Only one of the current sources 73 and 75 is turned on at one time. The negative current source 74 is turned on when a comparing amplifier 82 receives a signal from the X counter 41 through a line 83 and the comparing amplifier 82 indicates an error.

The capacitor 76 is connected to the magnetic deflection coils 21 and 22 through an operational amplifier 84, corrector circuitry 85, and a driver amplifier 86. The amplifier 84 forms an integrator along with the capacitor 76 and isolates the current sources 70–75 from the driver amplifier 86, which converts the voltage to current, and from the corrector circuitry 85.

The corrector circuitry 85 compensates for nonlinearity of the beam 11 to a degree so that the X electrostatic deflection plates 25 and 26 have to make only small corrections. Thus, the corrector circuitry 85 modifies the voltage ramp so that the beam deflection approaches linearity.

During retrace time, a portion of the feedback current from the coils 21 and 22 to the driver amplifier 86 is fed to the comparing amplifier 82 and compared with a reference signal on a line 87. With the comparing amplifier 82 receiving a signal through the line 83 from the X counter 41 during retrace time to turn on the comparing amplifier 82 and there is an error between the feedback from the coils 21 and 22 and the reference signal on the line 87, the comparing amplifier 82 turns on the negative current source 74 until the deflecting current in the coils 21 and 22 has returned to the initial starting value. This insures that the beam 11 has returned to its start position in the X direction.

By properly selecting the values of the positive constant current sources 70–73, the speed at which the beam 11 scans in the X direction during the various cycles is controlled. If the positive current source 70 is considered to be +I, then the sources 71 and 73 are +⅛ I, the source 72 is +1/256 I, and the source 75 is −⅛ I.

The negative constant current source 74 must have a magnitude sufficient to discharge the capacitor 76 in less time than the 48 microseconds of retract time. Thus, with the positive constant current source 70 considered to be +I, the source 74 would be approximately −50 I.

The current sources 73 and 75 are used primarily during the C cycle to move the beam left or right as required for focusing. They may be used at other times to program the beam movement as desired.

A similar type of magnetic deflection circuit is utilized with the Y deflection coils 23 and 24. This will not be described in detail.

Referring to FIG. 10, there is shown an electrostatic deflection circuit for controlling the X electrostatic deflection plates 25 and 26. The Y electrostatic deflection plates 27 and 28 would be controlled by a similar type of circuit.

The electrostatic circuit has an input from the X counter 41 through a line 90 to a clamping NPN-transistor 91, which resets the charge on a capacitor 92. The capacitor 92 is connected to a positive constant current source 93. The capacitor 92 and the constant current source 93 produce the bucking sawtooth, which is shown in FIG. 3*b*.

The capacitor 92 is connected through a high-impedance amplifier 94 to a main amplifier 95, which is connected to the X electrostatic deflection plates 25 and 26. The high-impedance amplifier 94 isolates the capacitor 92 from the main amplifier 95.

The registration-offset register 37 is connected to a plurality of positive constant current sources, which vary from +I to +64 I in a binary sequence with +I shown at 96 and +64 I shown at 97, and to a negative constant current source 98, which has a value of −128 I when compared with the positive current sources. The signal from the registration-offset register 37 on lines 120–127 determines which of the positive current sources and the negative current source 98 are turned on. By means of a grounded resistor 99, a DC voltage is applied to the main amplifier 95 through a high-impedance amplifier 100.

The correction register 36 is connected to a plurality of positive constant current sources, which vary in a binary sequence from +I to +32 I by lines 130–135. Positive current source 101 indicates +I while positive current source 102 indicates +32 I. The correction register 36 also is connected to a negative constant current source 103, which has a negative value of −64 I, by a line 136. The current sources 101–103 are connected to an amplifier 104, which has its output connected to the main amplifier 95.

The signal on the correction register 36 determines the positive current sources and the negative current source 103 that are turned on. The total value of the energized current sources determines the charging of a capacitor 105, which is connected through a resistor 106 to the output of the current sources.

Resistors 107 and 108 are connected in parallel with the amplifier 104 and also with the resistor 106 and the capacitor 105. An NPN-transistor 109 is connected between the resistors 107 and 108 and has its base connected by a line 110 to the X counter 41.

An NPN-transistor 111, which is symmetrical to the transistor 109, has its collector connected between the capacitor 105 and the resistor 106. The base of the transistor 111 is connected by a line 112 to the X counter 41.

At the end of each scan in the X direction and when the beam 11 is to be retraced, a signal is supplied to the line 112 to turn on the transistor 111. At this time, the transistor 109 is turned off. This results in current flowing through the resistors 107 and 108 to set an initial voltage on the capacitor 105.

When the beam 11 is again ready to scan the target, the transistor 109 is turned on by a signal from the X counter 41 through the line 110, and the transistor 111 is turned off by a signal from the X counter 41 through the line 112. When this occurs, the resistors 107 and 108 are shorted, and the capacitor 105 is charged from the current sources to generate the slope of the ramp for correction of the deviation of the beam 11 from linearity.

When the voltage on the capacitor 105 is set by turning the transistor 111 on and the transistor 109 off, the amplifier 104 is converted from an integrator to a current-summing-type amplifier. Thus, the value of the correction voltage at the beginning of each X scan is determined by the value of the selected current sources and the magnitudes of the resistances of the resistors 107 and 108 during the retrace time.

When the beam 11 is being calibrated in the B cycle during the calibration operation to determine the deflection of the beam 11 in the vertical or Y direction, the line 90 receives a signal to cause the bucking sawtooth to be applied for a period of four lines to the main amplifier 95. This bucking sawtooth is supplied due to a signal from the decode control 39 on the line 90 to the clamping transistor 91. During writing, the line 90 is activated by the X counter 41 such that the bucking sawtooth is operative for a period of one line.

The system of the present invention has been described as writing a pattern by exposing or not exposing each square of a 2,000 by 2,000 matrix. Each square of the matrix is equal in dimension to the minimum line width in the pattern to be written. This is done to maximize the speed with which the pattern can be written. That is, if the beam size were one-half of the minimum line width of the pattern, four spots would have to be written to expose a square having a one minimum line width on each side. The limiting factor is beam current density; thus, four times as long would be required to write the pattern.

Frequently, the grid upon which semiconductor devices are made is not as coarse as the minimum line width. With the described system, it would be necessary to write the pattern with a spot size equal to the smaller of the grid or minimum line size and take the penalties of speed and increase of pattern description data. However, through the use of a single control word and the offset feature of the register 37, the 2,000 by 2,000 matrix can be shifted a fraction of the minimum line width at any time in the X or Y direction or both by use of a control word included in the pattern description. The control word comes from the computer 18 through the buffer 38 and is placed in the registration-offset register 37. Actually, it is just the replacement of a portion of the registration word by a new combination of bits to alter the value of registration applied to the electrostatic deflection circuits 35. In the present invention, the change of registration can be made in increments of one-fourth of a minimum line width to provide an effective grid for patterns of 8,000 by 8,000.

While the present invention has described the beam 11 as square shaped, it should be understood that such is not mandatory for all operations of the method and apparatus of the present invention. Accordingly, the beam 11 could be round shaped, for example. However, deviations in the line produced by the round-shaped beam could preclude the use of the round-shaped beam in certain instances in which the resist is being exposed.

While the present invention has described the use of the focus grid 47 and the calibration grid 60, it should be understood that the focus grid 47 could be omitted and the calibration grid 60 utilized for focusing. In this arrangement, the focus detector 48 would still be employed.

While the present invention has described the beam 11 as having the various corrections made by the electrostatic deflection plates 25–28, it should be understood that high frequency magnetic deflection coils could be employed if desired. It is only necessary that a separate deflection means be utilized for correcting the beam position rather than employing the deflection means that moves the beam in the substantially raster fashion.

It should be understood that the range of control of the main deflection by the coils 21–24 is substantially the whole field coverage while the correction deflection by the plates 25–28 has only a small total range. Thus, a significant signal to noise advantage is obtained because errors and noise of a given percentage of the wide band width secondary deflection contribute only a small fraction of the total deflection range.

While the mechanical motion of the table 29, which supports the wafer 63, has been described as being performed with stepping motors, any suitable means of motion may be utilized. For example, DC motor drives or hydraulics could be employed. Furthermore, a position feedback system could be employed with any of the motive means.

While the present invention has been described as exposing a resist, it should be understood that exposure may be made of any other phenomenon. For example, there could be exposure of silicon dioxide that is to have its etch rate enhanced.

While the present invention has described the apparatus as being employed to expose the resist on the chips of a semiconductor wafer, it should be understood that the present invention may be employed anywhere that it is desired to correct or change the position of a beam, which moves in a substantially raster fashion, without affecting the history of the beam in its movement through the substantially raster fashion. Thus, for example, the present invention could be readily employed to produce engineering drawings on a cathode-ray tube or to control an electron beam welder or cutter.

While the present invention has described the electron detectors as being PIN diodes, it should be understood that any suitable electron detector could be used. For example, a scintilator-photomultiplier or a direct electron multiplier could be employed.

An advantage of this invention is that precise positioning of an electron beam on a target is obtained. Another advantage of this invention is that it produces patterns on chips of semiconductor wafers of relatively low volume at relative low cost. A further advantage of this invention is that it increases the yield of chips on semiconductor wafers without increasing the cost.

While the invention has been particularly shown and described with reference to a preferred embodiment thereof, it will be understood by those skilled in the art that various changes in form and details may be made therein without departing from the spirit and scope of the invention.

What is claimed is:

1. An apparatus for controlling the movement of a beam of charged particles comprising:

first deflection means for continuously deflecting the beam in a substantially raster fashion over a predetermined area; and second deflection means for bucking said first deflection means to stop and hold the beam at each of a plurality of predetermined positions along predetermined rasters for a predetermined period of time whereby the beam is stepped from each of the predetermined positions to another of the predetermined positions when said second deflection means is rendered ineffective after the predetermined period of time.

2. The apparatus according to claim 1 in which:

said first deflection means comprises means for generating an electromagnetic field;

and said second deflection means comprises means for generating an electrostatic field.

3. The apparatus according to claim 1 in which said beam is substantially square shaped.

4. An apparatus for controlling the movement of a beam of charged particles comprising:

first deflection means for continuously deflecting the beam in a substantially raster fashion over a predetermined area;

second deflection means to hold the beam at each of a plurality of predetermined positions for a predetermined period of time whereby the beam is stepped from each of the predetermined positions to another of the predetermined positions when said second deflection means is rendered ineffective after the predetermined period of time;

means to prevent the application of the beam except at the predetermined positions; and means to deflect the beam in a direction substantially normal to the scanning direction in which said first deflection means moves the beam in the raster fashion when said second deflection means is holding the beam against movement during scanning in the raster fashion by said first deflection means.

5. The apparatus according to claim 4 in which said second deflection means includes said normal deflection means.

6. The apparatus according to claim 5 in which:

said first deflection means comprises means for generating an electromagnetic field;

and said second deflection means comprises means for generating an electrostatic field.

7. The apparatus according to claim 4 in which said beam is substantially square shaped.

8. The apparatus according to claim 1 including:

means to ascertain the deviation of the raster field from a desired position on a material to be worked and means to deflect the beam to correct for the deviation of the raster field from the desired position.

9. The apparatus according to claim 8 in which said second deflection means includes said correction deflection means.

10. An apparatus for controlling the movement of a beam of charged particles comprising:

first deflection means for continuously deflecting the beam in a substantially raster fashion along a predetermined path over a known calibration pattern aligned in the raster field of said beam;

sensing means for detecting the position of the beam over the predetermined path, said sensing means providing a signal corresponding to the position of the beam;

means for comparing the signal of said sensing means with a predetermined deflection pattern to provide a deflection error signal proportional to the deviation of the signal from said comparing means relative to the deflection pattern;

means to store said deflection error signal; and second deflection means to modify the deflection of the beam by said first deflection means along the predetermined path in accordance with the error signal in said store means.

11. The apparatus according to claim 10 in which the beam is square shaped.

12. The apparatus according to claim 10 in which said second deflection means holds the beam at each of a plurality of predetermined positions for a predetermined period of time whereby the beam is stepped from each of the predetermined positions to another of the predetermined positions when said second deflection means is rendered ineffective after the predetermined period of time.

13. The apparatus according to claim 12 in which the beam is square shaped.

14. A method of precisely positioning a beam of charged particles comprising:

scanning a calibration pattern with the beam in a substantially raster fashion;

determining the error in deviation of the beam from the calibration pattern;

storing of the obtained calibration error information;

scanning at least a portion of material to have the beam applied thereto;

ascertaining the position error between the position of the portion of the material to which the beam is to be applied from a predetermined position;

and directing the beam over the material that is to have the beam applied thereto in accordance with a predetermined pattern as compensated by the stored calibration error information and the ascertained position error whereby the beam moves over the material to reproduce the predetermined pattern.

15. The method according to claim 14 in which the beam is a. held at each of a plurality of positions at which it is to be applied along predetermined rasters for b. a predetermined discrete period of time, and c. then stepped to the next position on the predetermined rasters.

16. The method according to claim 15 in which the beam is square shaped.

17. The method according to claim 14 including moving the beam substantially normal to its scanning path during some of its scanning operations for a predetermined period of time.

18. A method of precisely positioning a beam of charged particles comprising:

ascertaining the location of material to be worked relative to a known position by scanning at least a portion of the material with the beam;

directing the beam over the material in accordance with a predetermined pattern while compensating for the deviation of the location of the material from the known location;

stopping and holding the beam for a discrete period of time at each of a plurality of predetermined positions along predetermined rasters in accordance with the predetermined pattern;

and stepping the beam from one said predetermined position to another said predetermined position.

19. The method according to claim 18 including periodically determining the deviation of the beam from a previously defined raster pattern and compensating said beam for said deviation.

20. The method according to claim 18 in which the beam is directed over the material in accordance with the predetermined pattern by moving the beam in the same substantially raster fashion as is utilized in scanning while modifying the beam in accordance with the predetermined pattern.

21. A method of positioning a beam of charged particle comprising;

continuously moving the beam through a predetermined path;

sensing the deviation and astigmatism of said beam over said path relative to referenced values;

correcting the focus and astigmatism of said beam to predetermined values.

22. The apparatus of claim 1 including means to prevent the application of the beam except at the predetermined positions in accordance with a predetermined pattern.

23. The apparatus according to claim 10 including means for aligning a material to be worked in lieu of said known pattern with said raster field;

means for recurrently generating a bucking signal pattern to the deflection by said first deflection means for holding said beam at each of a plurality of predetermined positions for a predetermined discrete period of time along a raster for stepping said beam from one of a predetermined positions to another of a predetermined positions on a raster when said second deflection means is rendered ineffective after a predetermined period of time;

means for electrically compensating said bucking signal pattern in accordance with said error signal in said store means; and means for applying said compensated bucking signal to said second deflection means as said beam is scanned over said material to be worked.

24. The apparatus of claim 23 for sweeping said beam relative to an object including:

means for sensing the deviation of a portion of said material to be rastered from the raster field of said beam and provide a position error signal corresponding to said deviation; and means responsive to said position error signal for aligning said portion and said raster field.

25. The apparatus of claim 24 including:

means to index successive said portions of said material for alignment with said raster field of said beam.

26. An apparatus for controlling the movement of a beam of charged particles comprising:

a deflection means for continuously deflecting the beam in a substantially raster fashion along a predetermined path over a known pattern in the raster field of said beam;

sensing means for detecting the position of the beam over the predetermined path, said sensing means providing a signal corresponding to the position of the beam;

means for (a) comparing the signal of said sensing means with a predetermined deflection pattern and (b) to provide a deflection error signal proportional to the deviation of the signal from the predetermined pattern;

means to store said error signal; and correction means to modify the deflection of the beam by said deflection means along the predetermined path in accordance with the deflection error signal stored in said store means.

27. The apparatus of claim 1 including:

means for sensing the deviation of the raster field of said beam from a selected said predetermined area; and means responsive to said sensing means for aligning said raster field and said selected predetermined area.

28. An apparatus for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

29. The apparatus of claim 28 including:

means for sensing the deviation of the raster field of said beam from a selected said predetermined area; and means responsive to said sensing means for aligning said raster field and said selected predetermined area.

30. The apparatus of claim 28 including means to align the raster field of said beam with a plurality of said predetermined areas on the coated surface of said substrate for said exposure of the coated surface of said substrate thereat.

31. The apparatus of claim 30 including:

means for sensing the deviation of the raster field of said beam from a selected said predetermined area; and means responsive to said sensing means for aligning said raster field and said selected predetermined area.

32. The apparatus of claim 28 wherein said substrate comprises a resist-coated semiconductor element.

33. The apparatus of claim 32 including means for aligning the raster field of said beam with a plurality of said predetermined areas of said substrate for said exposure of the coated surface thereat.

34. The apparatus of claim 32 including:

means for sensing the deviation of the raster field of said beam from a selected said predetermined area; and means responsive to said sensing means for aligning said raster field and said selected predetermined area.

35. The apparatus of claim 34 including:

means for sensing the deviation of the raster field of said beam from a selected said predetermined area; and means responsive to said sensing means for aligning said raster field and said selected predetermined area.

36. An apparatus for controlling the movement of a beam of charged particles over a photosensitive coating carried on a surface of a substrate comprising:

first deflection means for continuously deflecting the beam in a substantially raster fashion along a predetermined path over a known calibration pattern in the raster field of said beam;

sensing means for detecting the position of the beam over the predetermined path with said sensing means providing a signal corresponding to the position of the beam;

means for comparing the signal of said sensing means with a predetermined deflection pattern to provide a deflection error signal proportional to the deviation of the signal from said comparing means relative to said deflection pattern;

means to store said error signal;

second deflection means to modify the deflection of the beam by said first deflection means along the predetermined pattern in accordance with the error signal from said store means;

means for aligning a predetermined area of the coated surface of said substrate and said raster field, in lieu of said calibration pattern;

means to expose said coated surface of said substrate in a predetermined pattern.

37. The apparatus of claim 36 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said positions along said predetermined rasters to expose said coated surface thereat.

38. The apparatus of claim 36 wherein said substrate comprises a resist-coated semiconductor element.

39. The apparatus of claim 38 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

40. The apparatus of claim 36 including means to intermittently stop and hold said beam at each of a plurality of predetermined positions along predetermined rasters of said beam for discrete predetermined periods of time whereby the beam is stepped from each of the predetermined positions to another of the predetermined positions; and means to prevent the application of the means except at selected said predetermined positions in accordance with a predetermined pattern.

41. The apparatus of claim 40 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

42. The apparatus of claim 40 wherein said substrate comprises a resist-coated semiconductor element.

43. The apparatus of claim 42 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

44. The apparatus of claim 40 wherein said means to stop and hold comprises a means for generating a bucking signal pattern to the deflection of said deflection means for holding said beam at said each of a plurality of predetermined positions for a predetermined discrete period of time along predetermined rasters for said stepping of said beam from one of said predetermined positions to another of said predetermined positions on selected rasters of said beam.

45. The apparatus of claim 44 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

46. The apparatus of claim 44 wherein said substrate comprises a resist-coated semiconductor element.

47. The apparatus of claim 46 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

48. The apparatus of claim 44 including means for compensating said bucking signal pattern in accordance with said error signal in said store means; and means for applying said compensated bucking signal to the deflection by said first deflection means as said beam is scanned over said substrate by said beam.

49. The apparatus of claim 48 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

50. The apparatus of claim 48 wherein said substrate comprises a resist-coated semiconductor element.

51. The apparatus of claim 50 for controlling the movement of a beam of charged particles over a photosensitive coating carried on a surface of a substrate comprising:

means for deflecting said beam in a substantially raster fashion over a predetermined area of the coated surface of said substrate;

means for stepping said beam at a plurality of predetermined positions along predetermined rasters in said predetermined area of the coated surface of said substrate with said beam being stopped and held at each said predetermined positions for a predetermined discrete period of time; and means to prevent application of the beam to said coated surface of said substrate except at selected said predetermined positions along said predetermined rasters to expose said coated surface thereat.

* * * * *